United States Patent [19]

Tuithof et al.

[11] Patent Number: 5,522,390

[45] Date of Patent: Jun. 4, 1996

[54] MAGNETIC RESONANCE IMAGING METHOD

[75] Inventors: Hans H. Tuithof; Johannes J. Van Vaals, both of Eindhoven, Netherlands; William T. Dixon, Atlanta, Ga.

[73] Assignee: U.S. Philips Corporation, New York, N.Y.

[21] Appl. No.: 184,498

[22] Filed: Nov. 13, 1992

[30]    Foreign Application Priority Data

Nov. 21, 1991 [EP] European Pat. Off. .............. 91203034

[51] Int. Cl.$^6$ .................................................. A61B 5/055
[52] U.S. Cl. ..................... 128/653.2; 128/653.3; 128/653.4; 324/309; 324/312
[58] Field of Search ............................ 128/653.2, 653.3, 128/653.4; 324/309, 312

[56]    References Cited

U.S. PATENT DOCUMENTS

| | | | |
|---|---|---|---|
| 4,779,619 | 10/1988 | Winkler .................. | 128/653.2 |
| 4,809,701 | 3/1989 | Le Bihan et al. ........... | 128/653.2 |
| 5,003,264 | 3/1991 | Koizumi et al. ............ | 324/309 |
| 5,190,744 | 2/1993 | Rocklage et al. ........... | 128/653.3 |

OTHER PUBLICATIONS

"First Pass Cardiac Perfusion" Evaluation with Ultrafast MR Imaging D. J. Atkinson et al, Radiology, Mar. 1990, pp. 757–762.

Recent Progress in Fast MR Imaging, J. J. Van Vaals et al, Medica Mundi, vol. 36, No. 2, 1991, pp. 152–167.

"Application of a Generalized Series Reconstruction Algorithm to Biologic MR Imaging" A. Webb et al, 1992 Ann. Meeting Printed Program Works in Progress Supplement Article P. 447.

*Primary Examiner*—Ruth S. Smith
*Attorney, Agent, or Firm*—Jack D. Slobod

[57]    ABSTRACT

A magnetic resonance imaging method is proposed for the following of a dynamic process in a body (5), such as perfusion in the brain by means of a contrast agent such as Gd-DTPA, or the effects of a physical stimulus. The dynamic process is followed by way of a multiple-slice MR measurement through, for example, 10 slices. In accordance with the invention, before or after the injection of the contrast agent, high-resolution reference images of the slices are formed, the same slices being measured with a lower resolution during the perfusion of the contrast agent. Substitution of the low-resolution data in data matrices containing high-resolution data produces, after Fourier transformation, images of the slices in which the measured changes in image intensities due to the contrast medium are reproduced in the high-resolution images.

17 Claims, 2 Drawing Sheets

MAGNETIC RESONANCE IMAGING METHOD

BACKGROUND OF THE INVENTION

1. Field of the Invention

The invention relates to a magnetic resonance imaging method for following a dynamic process in a body, in which method a local modification of magnetic resonance properties is induced in the body to produce a selective variation of magnetic resonance signals to be generated in the body, magnetic resonance signals being acquired during, or during and after the realisation of the modification by way of a first signal acquisition method in order to form a series of magnetic resonance images of the body enabling the dynamic process to be followed.

2. Description of the Related Art

A magnetic resonance imaging method of this kind is known from the article "First-Pass Cardiac Perfusion: Evaluation with Ultrafast MR Imaging", D. J. Atkinson et at., Radiology, March 1990, pp. 757–762. The cited article describes cardiac perfusion where, in order to modify the magnetic resonance properties, the contrast agent Gd-DTPA (Gadolinium diethylenetriaminepentaacetic acid) is injected into a body via veins in conjunction with an MR imaging method whereby strongly $T_1$-weighted NMR images are obtained. The NMR signals are enhanced by the Gd-DTPA. The imaging method consists of a 180° inversion pulse, followed by a gradient-echo signal acquisition method with very short repetition time (<4 ms). Suitable contrast is achieved by choosing the inversion time, i.e. the period of time elapsing between the inversion pulse and the gradient echo signal acquisition methods, so that the NMR signal is zero for non-enhanced myocardium and non-zero for enhanced myocardium in the case of cardiac perfusion. A high temporal resolution is necessary for the following of such a fast process, or another fast process such as perfusion in the brain, i.e. the signal acquisition method should be very fast. A high temporal resolution is usually achieved at the expense of spatial resolution. In the case of cardiac perfusion reasonably high spatial resolution requirements can still be satisfied, be it that gated imaging over a plurality of heart beats is then required. However, for example in the brain where a temporal resolution in the order of one second is required, during the following of such processes it is difficult to achieve suitable spatial resolution when practically feasible signal acquisition methods are used. When use is made of a fast Fourier imaging method, acquisition of only 40 profiles in the phase encoding direction will be possible, giving rise to undiagnostic NMR images, even after interpolation to a larger data matrix.

SUMMARY OF THE INVENTION

It is the object of the invention to provide a magnetic resonance imaging method of the kind set forth which produces suitable diagnostic NMR images.

To achieve this, a magnetic resonance imaging method in accordance with the invention is characterized in that the first signal acquisition method for following the dynamic process is a low-resolution method, and in that at an appropriate instant, using a second, high-resolution signal acquisition method magnetic resonance signals are acquired from the body in order to form at least one reference image of the body, signal samples of the magnetic resonance signals acquired by means of the low-resolution method being supplemented, prior to the formation of the series of magnetic resonance images, by signal samples of the magnetic resonance signals acquired by means of the high-resolution method. Thus, high-resolution NMR images are obtained in which the variations in image intensities due to local modifications of the magnetic resonance properties measured to follow the dynamic process are reproduced in the high-resolution images.

The formation of NMR images suitable for diagnostic purposes, in this manner is based on the understanding that for the spatial localisation of the modified magnetic resonance properties it often suffices to measure only the image intensity variations.

It is to be noted that U.S Pat. No. 5,003,264 describes the combination of low-resolution images with high-resolution images, but according to the cited patent specification the dynamic inage is high-resolution and the reference image is low-resolution instead of vice versa. The cited United States Patent describes a method which serves a completely different purpose, i.e. the imaging of a moving part of a body instead of a variation of contrast.

A first version of the magnetic resonance imaging method in accordance with the invention is characterized in that an enhancement agent is administered in order to realize the local modification of the magnetic resonance properties. Such an agent is, for example, a contrast agent such as Gd-DTPA; in tissue containing this agent, the longitudinal relaxation time constant $T_1$ is decreased. Enhancement agents which modify other magnetic resonance properties can also be used in accordance with the invention.

A second version of the method in accordance with the invention is characterized in that a physical stimulus is applied in order to realized the local modification of the magnetic resonance properties. Such a stimulus may be, for example, a local electrical stimulus which is transferred to the brain via fascicles so as to induce a modification which varies in time, for example a local increase/decrease of $T_1/T_2$ which can be detected by way of magnetic resonance. The stimulus may also be an optical stimulus of the eye.

The second, high-resolution, method can be executed during a period of time during which it is not necessary to follow time-critical processes so that a sufficient amount of time is available for these comparatively long measurements, for example, prior to the administration of the enhancement agent. However, a preferred version of the magnetic resonance imaging method in accordance with the invention is characterized in that the magnetic resonance signals are acquired by means of the second, high-resolution signal acquisition method after acquisition of the magnetic resonance signals by means of the first signal acquisition method. As a result, the high-resolution NMR images are recorded with a possibly enhanced contrast due to the presence of the enhancement agent in the body after termination of the relevant part of the dynamic process to be followed.

A version of a magnetic resonance imaging method in accordance with the invention is characterized in that the reference images are images of slices of a volume portion of the body in which the dynamic process takes place, the series of magnetic resonance images comprising a number of images of the slices. The dynamic process in a volume portion of the body can thus be followed by forming a plurality of images of the slices in rapid succession, the magnetic resonance signals being acquired by, for example, a multiple-slice signal acquisition method or a 3D signal acquisition method, without giving rise to undiagnostic images due to loss of focus in the images as would be the case, for example, when use is made of interpolation methods.

In further versions of the method in accordance with the invention substitution of data in matrices of reference data may be performed in a symmetrical or asymmetrical manner in, for example, a phase-encoding direction of matrices of signal samples, asymmetrical versions offering the advantage that as high as possible resolution is achieved also when a comparatively small number of profiles is measured in the phase-encoding direction. Moreover, a gain in time can be traded off against improved contrast. In order to avoid image artefacts, during an asymmetrical measurement it is desirable to fill out the asymmetry by combining amplitude data of the dynamic images with phase data of the reference measurements.

Another version of a magnetic resonance imaging method in accordance with the invention which offers a better image contrast is characterized in that per reference image the high-resolution method comprises a number of gradient-echo sequences preceded by inversion pulses, signal samples thereof filling data matrices in a mosaic-like manner, the low-resolution method comprising similar sequences whose signal samples partly substitute high-resolution data in the data matrices.

BRIEF DESCRIPTION OF THE DRAWINGS

The invention will be described in detail hereinafter with reference to a drawing, therein.

DETAILED DESCRIPTION OF THE PREFERRED EMBODIMENTS

Figure 1:
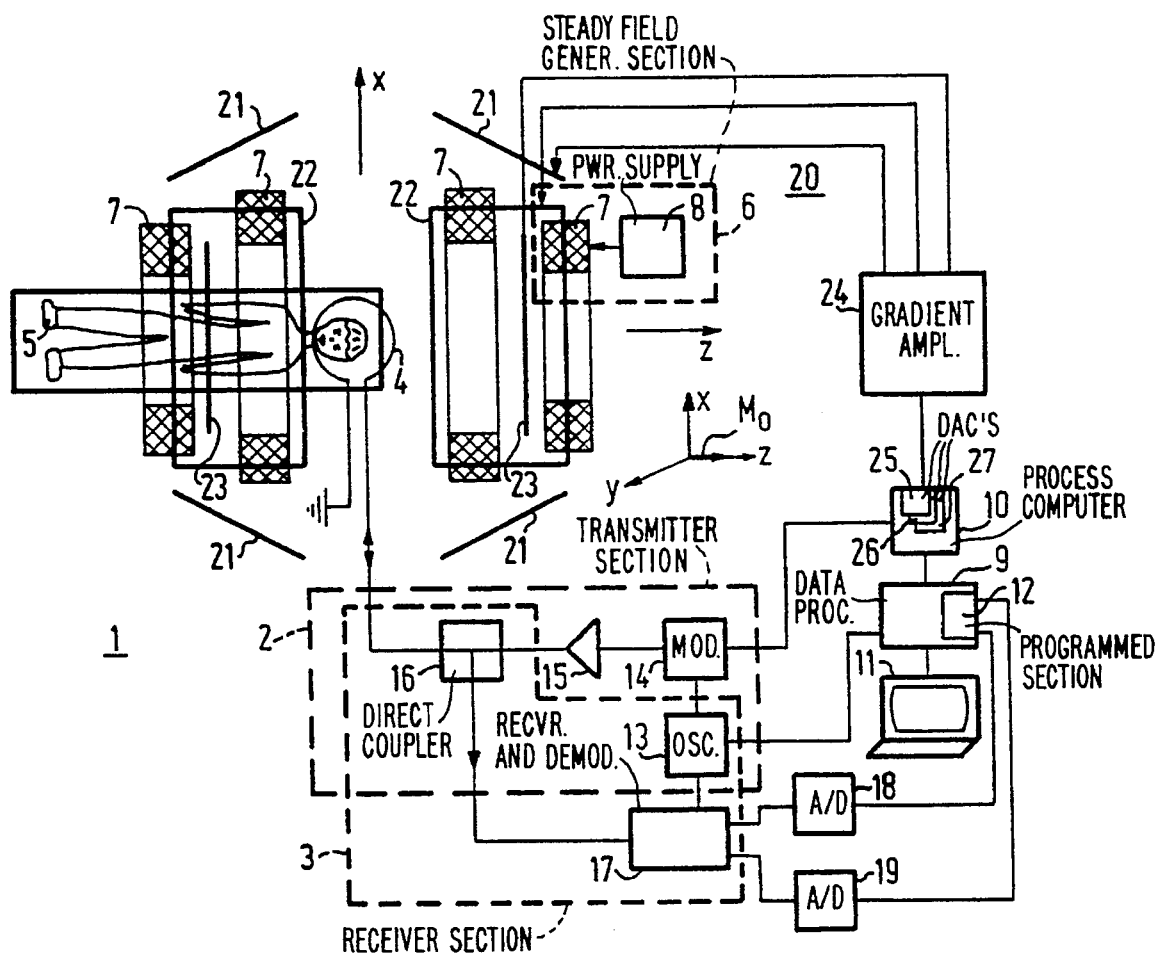
FIG. 1 shows diagrammatically a magnetic resonance imaging device in accordance with the invention.

FIG. 1 shows diagrammatically a magnetic resonance imaging device 1 in accordance with the invention, comprising transmitter section 2 and receiver section 3 for transmitting high-frequency electromagnetic pulses, via a transmitter/receiver coil 4, to an object 5 and for receiving magnetic resonance signals which are generated by the high-frequency electromagnetic pulses in the object 5 which is situated in a steady, uniform magnetic field. The transmitter/receiver coil 4 may be a single coil, but may alternatively be formed by a separate transmitter coil and a separate receiver coil. The device 1 includes sections 6 for generating the steady field. The steady field generating section 6 includes magnet coils 7 and, in the case of resistive magnets or superconducting magnets, a power supply 8. The power supply 8 is absent in the case of a permanent magnet. During operation of the device 1 with the object 5 arranged within the magnet coils 7, a slight excess of nuclear spins (of nuclei having a magnetic moment) will be oriented in the same direction as the steady field in a state of equilibrium. From a macroscopic point of view, this is to be considered a magnetization $M_0$, being an equilibrium magnetization. The device 1 furthermore includes a data processor 9 which is coupled to the transmitter section 2 and the receiver section 3, a process computer 10 which is coupled to the data processor 9 and the transmitter section 2, and a display 11 for displaying a nuclear magnetization distribution which is determined, by way of programmed section 12 of data processor 9 from resonance signals received and demodulated by the receiver means 3, after signal sampling thereof (detection of resonance signals). More specifically, the transmitter section 2 includes a high-frequency oscillator 13 for generating a carrier signal, a modulator 14 for amplitude and/or phase and frequency modulation of the carrier signal, a power amplifier 15, and a directional coupler 16 which is coupled to the transmitter/receiver coil 4. The high-frequency oscillator 13 is coupled to the data processor 9 and the modulator 14 is coupled to the process computer 10. When excitation pulses are applied to the object 5 via the transmitter section 2 and under the control of the programmed section 12, said excitation pulses having a frequency content around the so-called Larmor frequency of, for example, protons in the applied magnetic field, magnetic resonance signals will be produced wherefrom a proton nuclear spin distribution or a magnetic resonance image can be determined by the programmed section 12, using for example Fourier transformation. The receiver section 3 for receiving the resonance signals includes the directional coupler 16 and a receiver and demodulation unit 17. The unit 17 may be a double phase-sensitive detector whose output signals are sampled by means of a first and a second analog-to-digital converter 18, 19. The A/D converters 18 and 19 are coupled to the data processor 9. The transmitter and receiver section 2 and 3 may alternatively be formed by a so-called phase-coherent digital transmitter/receiver. The device 1 furthermore includes section 20 for generating magnetic field gradients superposed on the steady, uniform field. The gradient generating section 20 includes gradient magnet coils 21, 22 and 23 for generating magnetic field gradients $G_x$, $G_y$ and $G_z$ and a power supply which can be controlled by the process computer 10 and which includes gradient amplifiers 24 for powering the gradient magnet coils 21, 22 and 23 which are individually activatable. The process computer 10 has digital-to-analog converters 25, 26 and 27 for supplying the gradient power supply 24 with analog gradient waveforms, while supplying digital codes and under the control of the process computer 10, the respective gradients $G_x$, $G_y$ and $G_z$ thus being generated. For example, in the case of two-dimensional Fourier transformation (2D-FT) $G_x$ is a measuring gradient, $G_y$ is a phase-encoding gradient, and $G_z$ is a selection gradient. In the case of three-dimensional Fourier transformation (3D-FT) $G_z$ may be a further phase-encoding gradient. In the embodiment shown, the arrangement in space of the gradient magnet coils is such that the direction of the magnetic field of the gradient fields coincides with the direction of the steady, uniform magnetic field, the gradient directions extending perpendicularly to one another as denoted by three mutually perpendicular axes x, y and z in FIG. 1. The magnetic resonance signals wherefrom a nuclear spin distribution can be reconstructed by way of Fourier transformation are acquired by means of so-called measuring sequences.

Figure 2:
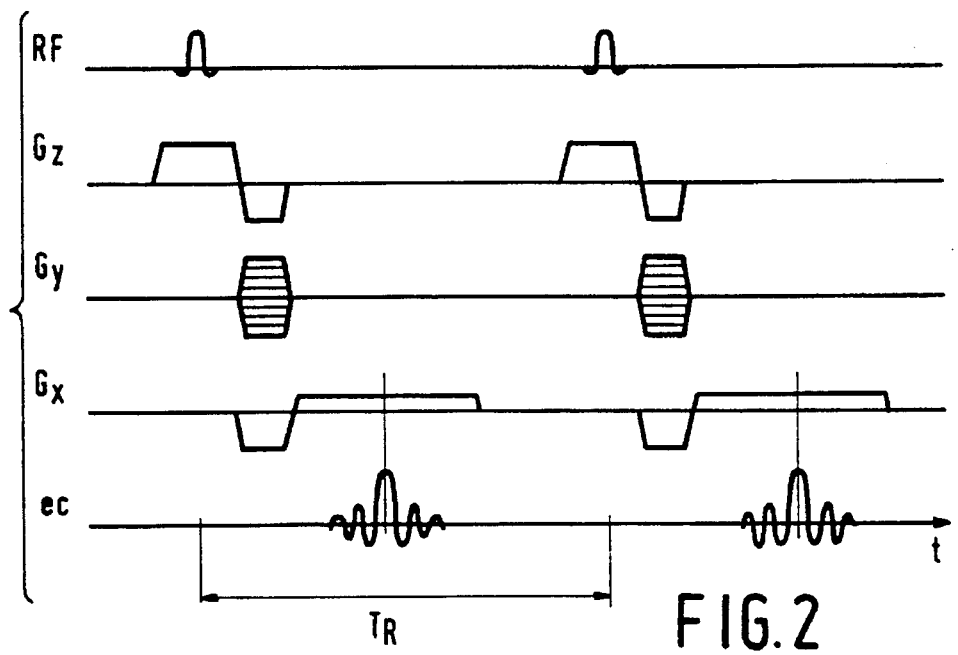
FIG. 2 illustrates a signal acquisition method for use in a magnetic resonance imaging method in accordance with the invention.

FIG. 2 shows a signal acquisition RF and gradient pulse sequence for use in a magnetic resonance imaging method in accordance with the invention. It concerns a Fourier method where high-frequency electromagnetic pulses RF are applied to the body 5 as a function of time t by the transmitter section 2 in order to excite nuclear spins in the body 5. The nuclear spins are excited in a slice-selective manner by applying, using the gradient magnet coils 23, a selection gradient $G_z$ to the body 5 simultaneously with the pulses RF. A given slice of the body can be selected by variation of the frequency of the oscillator 13. Thus, a plurality of slices can be selected in a volume by means of a so-called multiple-slice signal acquisition method. The Fourier method furthermore comprises a phase-encoding gradient $G_y$, to be applied by means of the gradient magnet coils 22, and a measuring gradient $G_x$ to be applied by the gradient magnet coils 21. By variation of the amplitude of the phase-encoding gradient $G_y$ and by sampling of the magnetic resonance signals ec, per slice there are obtained dam matrices wherefrom magnetic resonance images are derived by Fourier transformation. The signal acquisition process for a slice can be represented in the so-called k-space in order to describe signal sampling and processing. For a more detailed description, reference is made to the article "The k-trajectory formulation of the NMR imaging process with applications in analysis and synthesis of imaging methods", Meds. Phys., Vol. 10, 1983, pp. 610–621. In the k-space description the distance from the origin, and hence the spatial frequency information derived from signal samples of the magnetic resonance signal ec, depends exclusively on the variation of the phase-encoding gradients $G_x$ and $G_y$ as a function of time t. Therein, the vertical axis of the k-space usually describes the phase and the horizontal axis describes the frequency of the magnetic resonance signal. In the case of a 3D signal acquisition method where the high-frequency electromagnetic pulses are non-selective and another phase-encoding gradient is also applied, a third axis also exists. Signals corresponding to low spatial frequencies, determining mainly the image intensities, are concentrated around the origin of the k-space. Information of high spatial frequencies (for example, sharp transitions of the structures imaged) are situated further from the origin: the encoding of details of the body 5 is thus improved by prolonging the duration of application of the gradients or by increasing their amplitude. Each location in the k-space corresponds to a combination of integrals over the applied gradients. Because these integrated gradients develop in time, the location of the magnetic resonance signal describes a trajectory in the k-space. Data is obtained at selected points within the k-space by measurement of the NMR signals at different instants and for different integrated gradients. The NMR signal is usually highest when the integral over the gradients is zero (i.e. when the magnetic resonance signal is not disturbed by gradients). A magnetic resonance image is obtained by a Fourier transformation of a data matrix over the k-space. When only low k-profiles axe measured, a low-resolution NMR image is obtained; when high k-profiles are also measured, a high-resolution NMR image is obtained. In accordance with the invention, during a period during which no time-critical processes are followed in the body 5, for example prior to application of an enhancement agent to the body 5, magnetic resonance signals are generated in the body 5 by means of a magnetic resonance imaging method which may be a multiple-slice method, said resonance signals being used to determine high-resolution reference data matrices for a number of slices in a volume of the body. In the case of a multiple-slice method, the sequence shown in FIG. 2 is repeated a number of times while varying the frequency of the oscillator 13 in order to excite different slices in the volume and also while varying the phase-encoding gradient $G_y$ for phase-encoding of the nuclear spins. Data matrices of signal samples are thus mapped on the k-space. For example, 5 slices are mapped through which the dynamic process to be followed occurs, the resolution in the k-space being 256 signal samples in the frequency direction of the k-space and 256 phase-encoding steps in the phase direction of the k-space. The sequence repetition time $T_R$ may be, for example 10 ms so that an overall measuring time of more than 10 seconds is required so as to obtain five 256×256 high-resolution reference images. The reference images are derived from the data matrices by Fourier transformation. After local modification of the magnetic resonance properties in the body, for example by a physical stimulus or by administration of a contrast agent, images of the slices will be formed in rapid succession in order to enable the dynamic process in the volume to be followed. For example, in order to enable the following of perfusion of a contrast agent in the brain, it is necessary to form a magnetic resonance image of the five slices every second and to repeat this a number of times, for example fifteen times. Thus, per image 200 ms is available. For a sequence repetition time amounting to 5–10 ms, 20–40 phase-encoding profiles can thus be measured per image. In accordance with the invention, use is made of a low-resolution method with 20–40 profiles in the present example, for example utilizing sequences as described with reference to FIG. 2, to enable following of the dynamic process for five slices in the volume in the present example. Prior to or after a first Fourier transformation over the profiles obtained by the low-resolution method for the respective slices, the low-resolution data for following the dynamic process is substituted in the corresponding high-resolution matrices at the position of the central profiles, i.e. for k-values around zero in the k-space. After a further Fourier transformation over the modified high-resolution data matrices, NMR images are obtained which have a high spatial resolution and in which the variations of image intensities due to the contrast agent have been measured and reproduced with a high temporal resolution. NMR images suitable for diagnostic purposes are thus obtained. Not only perfusion in the brain, but other fast processes can also be followed, for example Gd-DTPA inflow in the kidneys, the taking up of Gd-DTPA in mammary tumors, and the effects of cardiac infarction. It is to be noted that a contrast agent such as Gd-DTPA can be administered only once per in vivo examination of a body because of the long period of time required by the Gd-DTPA to leave the body. It is to be noted, however, that contrast agents other than Gd-DTPA can also be used.

The high-resolution signals can be acquired not only prior to, but also subsequent to the measurements on the inflowing enhancement agent. In the latter case the increase of contrast occurring due to the substantially steady presence of the enhancement agent in the body is used in the high-resolution reference image. If possible, the high-resolution signals can also be acquired during a period after the administration of the enhancement agent to the body, with no dynamic processes to be followed occurring during such a period, for example because the enhancement agent has not yet reached the part of the body to be examined. It is not necessary to acquire the high-resolution signals directly before or directly subsequent to the acquisition of the low-resolution signals. When a sufficiently accurate position determination can be achieved, the high-resolution signals can be acquired a prolonged period of time before or after the low-resolution signals are acquired.

Figure 3A:
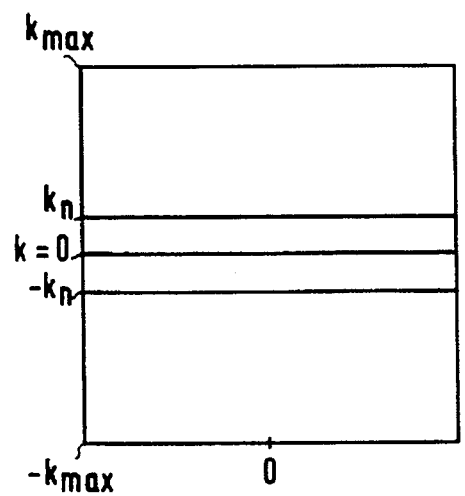
FIGS. 3A and 3B show, diagrammatically in the k-space, the method in accordance with the invention.
Figure 3B:
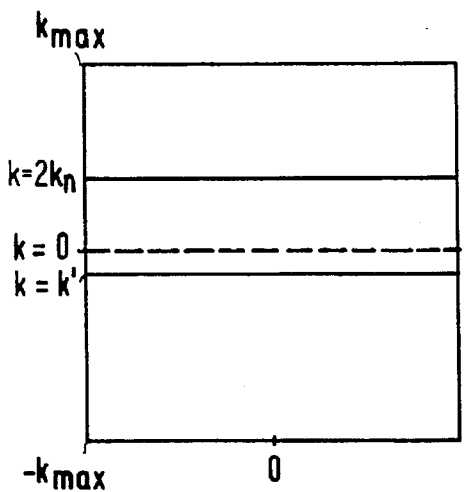

FIGS. 3A and 3B show the method in accordance with the invention in the k-space. FIG. 3A illustrates the symmetrical filling of the k-space with low-resolution data around k=0 after administration of the contrast agent, represented by a band of k-values $k_n$ to $-k_n$, where n =10 to 20, i.e. 20 to 40 k-profiles. $k_{max}$ and $-k_{max}$ denote the extreme k-values of the high resolution matrices. FIG. 3B shows asymmetrical filling of the k-space with the low-resolution data with a band from k=k" to k=2k$_n$, where n is the same number as with respect to FIG. 3A. Therein, k' may have one of the values k'=0, −1, −2, . . . Consequently, using a still limited number of profiles a resolution can be achieved for the dynamic process which is better than that achieved by means of the filling of the high-resolution data matrix as shown in FIG. 3A. It is to be noted, however, that for the filling of the high-resolution data matrix as shown in FIG. 3B an estimate must be made for the profiles from k=2k$_n$ to k=−k'−1 so as to avoid disturbing image artefacts. As an estimate for the latter profiles use can be made of amplitudes of data for k=k' to k=2k$_n$, supplemented by phase information from the high-resolution measurement or phase information from corresponding positive profiles. When the number of low-resolution profiles measured is too small, too little difference in contrast will occur in successive images of a slice, which also indicates that it is advantageous to utilize a partial matrix process in the phase direction of the k-space. Furthermore, partial matrix processes can also be used in the frequency direction of the k-space, even though corrections will then be required so as to obtain artefact-free images.

Figure 4:
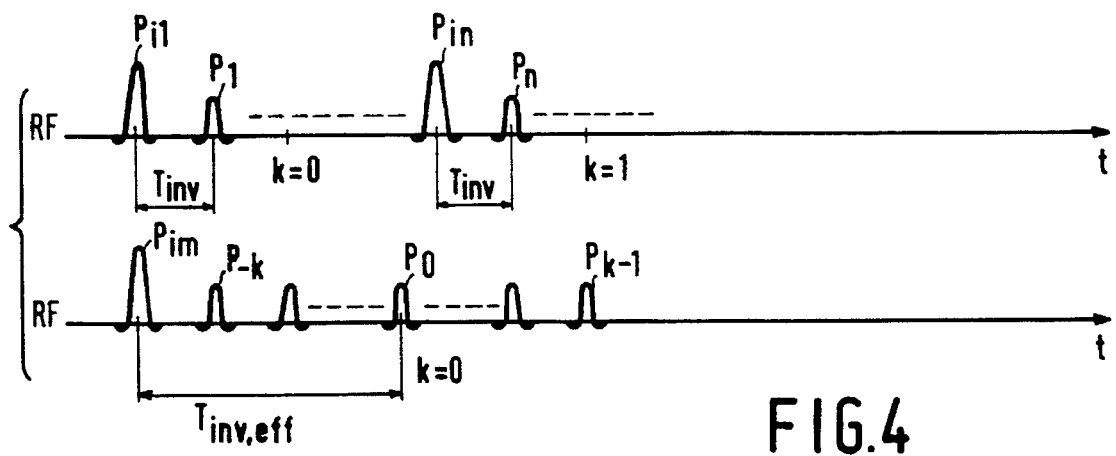
FIG. 4 shows another magnetic resonance imaging method in accordance with the invention.

FIG. 4 shows another magnetic resonance imaging method in accordance with the invention, only sequences of high-frequency electromagnetic pulses being shown as a function of time t. The pulses $P_{i1}$, . . . , $P_{in}$ and $P_{im}$ therein are inversion pulses which invert the magnetization of nuclear spins, the pulses $P_1$, . . . $P_n$ being an abbreviated notation for a number of sequences as shown in FIG. 2, and the pulses $P_{-k}$, . . . , $P_0$, $P_{k-1}$ being an abbreviated notation for a single sequence as shown in FIG. 2, a symmetrical filling with low-resolution profiles of the high-resolution matrix is indicated, for example for k=19, i.e. in that case there are 40 low-resolution profiles. Thus, using an abbreviated notation, the upper line of FIG. 4 represents a multipleslice Fourier method in which, after each inversion pulse $P_{i1}$ to $P_{in}$, a number of k-profiles is measured or shifted around k=0, k=1, k=−1, etc. This sequence is repeated for each slice. The bottom line shows the sequence for data acquisition after administration of the stimulus or the contrast agent. In the high-resolution sequence on the upper line the inversion time $T_{inv}$ is represented and on the lower line an effective inversion time $T_{inv,eff}$ is represented for the low-resolution sequence around the k-profile k=0. Subdivision of the high-resolution sequence into sub-sequences as shown on the upper line of FIG. 4, where the k-space is filled in a mosaic-like fashion, is performed to enable the low-resolution sequence to be executed with an effective inversion time which is equal to the inversion time of the high-resolution sequence. Such a choice is made so as to enable combination of images of comparable $T_1$ contrast. The use of inversion pulses offers the advantage that greater differences in contrast occur between successive images of a slice, so that the dynamic process can be followed better.

In addition to the described embodiments, many alternatives are feasible within the scope of the invention. For example, the first and the second acquisition method may be so-called echoplanar methods, the first signal acquisition method being a mosaic-like ultrafast echoplanar method while the second signal acquisition method is a comparatively slow high-resolution echoplanar method. Other fast signal acquisition methods can also be used, for example a so-called turbo spin echo sequence whose details are described in the article "Recent progress in fast MR imaging", J. J. van Vaals et al., Medica Mundi, Vol. 36, No. 2, 1991, pp 152–167. Mixed signal acquisition methods can also be used, for example a combination of an echoplanar method and a multiple shot gradient echo method, even though in the latter case it will be more difficult to make the signals acquired by the various methods suitably compatible, i.e. it will be more difficult to achieve suitable contrast matching.

We claim:

1. A magnetic resonance imaging method for following a dynamic process in a body, comprising inducing a local modification of magnetic resonance properties in the body for the selective variation of magnetic resonance signals to be generated in the body, acquiring magnetic resonance signals during realization of the modification using a low-resolution first signal acquisition method corresponding to a series of magnetic resonance images of the body enabling the dynamic process to be followed, and at a time when the dynamic process is not being followed, acquiring magnetic resonance signals from the body using a high-resolution second signal acquisition method corresponding to one or more reference images of the body, supplementing sets of signal samples of the magnetic resonance signals acquired by means of the low-resolution method by signal samples of the magnetic resonance signals acquired by means of the high-resolution method to form supplemented sets of magnetic resonance signals, and forming a series of magnetic resonance images from the supplemented sets of magnetic resonance signals.

2. A magnetic resonance imaging method as claimed in claim 1, wherein the inducing the local modification of the magnetic resonance properties is done by introducing an enhancement agent into the body.

3. A magnetic resonance imaging method as claimed in claim 1, wherein the inducing the local modification of the magnetic resonance properties is done by causing physical stimulation of the body.

4. A magnetic resonance imaging method as claimed in claim 1, wherein the magnetic resonance signals are acquired by means of the second, high-resolution signal acquisition method after acquisition of the magnetic resonance signals by means of the first signal acquisition method.

5. A magnetic resonance imaging method as claimed in claim 4, wherein the inducing the local modification of the magnetic resonance properties is done by introducing an enhancement agent into the body.

6. A magnetic resonance imaging method as claimed in claim 4, wherein the inducing the local modification of the magnetic resonance properties is done by causing physical stimulation of the body.

7. A magnetic resonance imaging method as claimed in claim 1, wherein the reference images are images of slices of a volume part of the body in which the dynamic process takes place, the series of magnetic resonance images comprising a number of images of the slices.

8. A magnetic resonance imaging method as claimed in claim 7, wherein the inducing the local modification of the magnetic resonance properties is done by introducing an enhancement agent into the body.

9. A magnetic resonance imaging method as claimed in claim 7, wherein the inducing the local modification of the magnetic resonance properties is done by causing physical stimulation of the body.

10. A magnetic resonance imaging method as claimed in claim 1, wherein the first and the second signal acquisition method are Fourier methods comprising a high-frequency excitation pulse, a phase-encoding gradient and a read-out gradient, the signal samples obtained by means of the high-resolution method being stored in data matrices, the signal samples obtained by means of the low-resolution method being substituted in the data matrices.

11. A magnetic resonance imaging method as claimed in claim 10, wherein the substitution is symmetrical.

12. A magnetic resonance imaging method as claimed in claim 10, wherein the substitution is asymmetrical.

13. A magnetic resonance imaging method as claimed in claim 10, wherein the inducing the local modification of the magnetic resonance properties is done by introducing an enhancement agent into the body.

14. A magnetic resonance imaging method as claimed in claim 10, wherein the inducing the local modification of the magnetic resonance properties is done by causing physical stimulation of the body.

15. A magnetic resonance imaging method as claimed in claim 1, wherein the first and second signal acquisition methods are echoplanar methods.

16. A magnetic resonance imaging method as claimed in claim 1, wherein per reference image the high-resolution method comprises a number of gradient-echo sequences preceded by inversion pulses, signal samples thereof filling data matrices in a mosaic-like manner, the low-resolution method comprising similar sequences, signal samples thereof partly substituting high-resolution data in the data matrices.

17. A magnetic resonance imaging method as claimed in claim 1 wherein the dynamic process is perfusion of an enhancement agent in the brain or the heart in the body or the taking up of an enhancement agent in the mammary tumors in the body.

* * * * *